(12) United States Patent
Ishii et al.

(10) Patent No.: US 8,127,647 B2
(45) Date of Patent: Mar. 6, 2012

(54) PROTECTIVE TAPE CUTTING METHOD FOR SEMICONDUCTOR WAFER AND DEVICE OF THE SAME

(75) Inventors: Naoki Ishii, Kameyama (JP); Masayuki Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 555 days.

(21) Appl. No.: 12/276,343

(22) Filed: Nov. 23, 2008

(65) Prior Publication Data

US 2009/0133549 A1    May 28, 2009

(30) Foreign Application Priority Data

Nov. 27, 2007 (JP) ................... 2007-306104

(51) Int. Cl.
*B32B 38/04* (2006.01)
(52) U.S. Cl. ............... 83/56; 83/100; 83/101; 83/929.1; 156/267
(58) Field of Classification Search ............ 83/22, 56, 83/98, 100, 101, 169, 177, 215, 216, 218, 83/483, 490, 929.1; 156/250, 253, 267, 270, 156/523; 451/456
See application file for complete search history.

(56) References Cited

U.S. PATENT DOCUMENTS

| | | | | |
|---|---|---|---|---|
| 3,882,644 A | * | 5/1975 | Cusumano | 451/359 |
| 3,987,589 A | * | 10/1976 | Marton | 451/359 |
| 4,925,515 A | * | 5/1990 | Yoshimura et al. | 156/250 |
| 6,638,148 B2 | * | 10/2003 | Chopra et al. | 451/56 |
| 2006/0219353 A1 | * | 10/2006 | Mori et al. | 156/267 |

FOREIGN PATENT DOCUMENTS

JP    2005-123595 A    5/2005

OTHER PUBLICATIONS

The First Office Action for the Application No. CN 200810180123.2 from The Stated Intellectual Property Office of People's Republic of China dated May 31, 2011.

* cited by examiner

*Primary Examiner* — Edward Landrum
(74) *Attorney, Agent, or Firm* — Cheng Law Group, PLLC

(57) ABSTRACT

A cutter blade is relatively moved along an outer periphery of a semiconductor wafer, and dust generated at a tape cutting site by the cutter blade and attached to an upper surface of the protective tape is collected with a dust collecting member which relatively moves with the cutter blade with respect to the semiconductor wafer, and the dust collected at a predetermined portion is suctioned and removed with a suction nozzle after the completion of tape cutting.

9 Claims, 16 Drawing Sheets

PROTECTIVE TAPE CUTTING METHOD FOR SEMICONDUCTOR WAFER AND DEVICE OF THE SAME

BACKGROUND OF THE INVENTION (1) Field of the Invention

The present invention relates to a protective tape cutting method for cutting out a protective tape on a semiconductor wafer joined to a surface of the semiconductor wafer along an outer shape of the wafer, and a device of the same.

(2) Description of the Related Art

The method for cutting the protective tape joined to the surface of the semiconductor wafer may be for example carried out in the following manner. A cutter unit having a cutter blade arranged at a free end of a supporting arm, which rotates about a vertical axis passing through the center of the semiconductor wafer, is arranged, and the cutter blade runs along an outer periphery of the wafer with the rotation of the supporting arm. The protective tape is thereby cut along the outer shape of the wafer (see Japanese Laid-Open Patent Publication No. 2005-123595).

When cutting the protective tape, chips are generated as microscopic dust at the cut edge of the protective tape and freed. The dust attached on the protective tape will lead some troubles in the subsequent wafer processing if attached on the protective tape. In particular, when the semiconductor wafer joined with the protective tape is subjected to various processing in a heating atmosphere, the protective tape with excellent heat resistance is used. Such protective tape is mixed with a substance (e.g., silica and the like) for enhancing the heat resistance property. Such mixed substance becomes the microscopic dust when the tape is cut, and tends to be easily freed. Therefore, contamination or damages on the protective tape with dust may be generated more easily.

SUMMARY OF THE INVENTION

It is an object of the present invention to provide a method for cutting a protective tape on a semiconductor wafer capable of cutting the protective tape while appropriately removing the dust generated by the cutting of the tape, and the device of the same.

In order to achieve the above object, the invention employs the following configuration.

There is provided a method for cutting a protective tape on a semiconductor wafer joined to the semiconductor wafer along an outer shape of the wafer; the method including the steps of relatively moving a cutter blade along an outer periphery of the semiconductor wafer, and collecting dust generated at a tape cutting site by the cutter blade and attached to an upper surface of the protective tape with a dust collecting member which relatively moves with the cutter blade with respect to the semiconductor wafer; and suctioning and removing the dust collected at a predetermined portion by the dust collecting member with a suction device after the completion of tape cutting.

According to the method for cutting the protective tape on the semiconductor wafer of the present invention, the dust freed from a tape cut edge with the tape cutting and attached to the tape is collected at a predetermined portion by the dust collecting member. After completing the tape cutting, the dust is suctioned and removed by the suction device. In this case, since the dust is collected at one portion, the dust can be easily suctioned, and thus the dust can be efficiently removed. Therefore, contamination or damages from attachment of the dust to the protective tape can be avoided, and consequently, adverse affect in the post-process can be eliminated. For instance, when suctioning the protective tape surface in grinding the back surface, the semiconductor wafer is held in plane since dust does not exist on the suction surface, whereby an even back surface grinding can be performed.

In the above method, the dust may be removed in the following manner.

For instance, the suction and removal are carried out by suctioning the collected dust with the suction device, and blowing air to the dust from an air nozzle.

According to such a method, even the dust strongly attached to the tape can be reliably freed and removed from the surface of the protective tape by air blow, and suctioned with the suction device.

In the above method, the suction is started before the start of the air blow.

According to such a method, the freed dust above the protective tape by the air blow will not be improperly scattered since the dust suction operation by the suction device is first performed. Therefore, when carrying out the relevant process in a clean room, not only the contamination or damages of the semiconductor wafer but contamination or damages of the room can be suppressed, and high cleanliness can be maintained.

Furthermore, in the above method, the dust collecting member is a brush; the dust is collected with the brush before operating the suction device; and the air blow is performed on the brush and the dust from the air nozzle while lifting up the brush to be moved away from the semiconductor wafer.

According to such a method, even the dust attached to the brush can be removed, and thus the cleanliness of the surface of the protective tape, the semiconductor wafer, and the clean room can be further enhanced.

In the above method, the dust collecting member is a brush; the dust is collected with the brush before operating the suction device; and vibration is applied to the brush after lifting up the brush to be moved away from the semiconductor wafer.

In this method, the dropping dust is preferably suctioned and removed while applying vibration to the brush.

According to such a method, a clean brush without attachment of dust can be continuously used. Therefore, re-attachment of dust to the protective tape can be avoided.

In the method, the air blow and the suction are performed while moving the air nozzle closer towards the suction device.

According to this method, the dust is gradually blown closer to the suction device by the air blow from a distant position of the suction device. Therefore, as the dust becomes closer to the suction device, the air blow and the suction interact with each other, thereby generating a strong air flow, and thus the dust is strongly blown and guided to the suction device without remaining on the tape.

In the method, the dust generated at the tape cutting site is gathered and collected on the wafer side from the tape cutting site by the dust collecting member.

Alternatively, the dust is suctioned and removed after separating and removing an unnecessary tape on an outer side of the wafer after cutting the tape by the cutter blade.

According to such method, the dust is avoided from remaining on the unnecessary tape side cut out in a wafer shape after cutting the protective tape. That is, the attached dust is prevented from scattering and again contaminating or damaging the protective tape and the like when separating and collecting the unnecessary tape.

In order to achieve the above object, the invention employs the following configuration.

A device for cutting a protective tape cutting method joined on the semiconductor wafer along an outer shape of the wafer;

the device including drive means for relatively moving a cutter blade along an outer periphery of the semiconductor wafer; a dust collecting member for collecting dust generated at a tape cutting site by the cutter blade by relatively moving in a direction identical to the cutter blade with respect to the semiconductor wafer; and a suction device facing a portion where the dust is collected.

According to the device for cutting the protective tape on the semiconductor wafer of the present invention, the method invention can be suitably realized.

The device further preferably includes an air nozzle, arranged facing a suction opening of the suction device, for freeing the collected dust from the protective tape by air blow.

According to such a configuration, even the dust strongly attached to the tape can be reliably suctioned and removed with the suction device by being freed from the surface of the protective tape by air blow.

In this configuration, the dust collecting member is preferably attached to a cutter unit equipped with the cutter blade.

According to such a configuration, the dust collecting member can be constantly maintained in a predetermined position with respect to the tape cutting site by the cutter blade. Therefore, the dust generated at the tape cut edge can be accurately collected.

The dust collecting member is preferably configured such that the angle with respect to a movement direction is adjustable.

According to such a configuration, the installation angle of the dust collecting member can be set to an attitude corresponding to a movement curvature even if the size of the semiconductor wafer is changed and the curvature of the rotation of the cutter blade becomes different. That is, the dust collecting member can be constantly slidably contacted and moved on the tape cut edge. Therefore, an appropriate dust collecting function can always be exhibited regardless of the size of the semiconductor wafer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE PREFERRED EMBODIMENTS

Embodiments of the present invention will be described with reference to the drawings.

Figure 1:
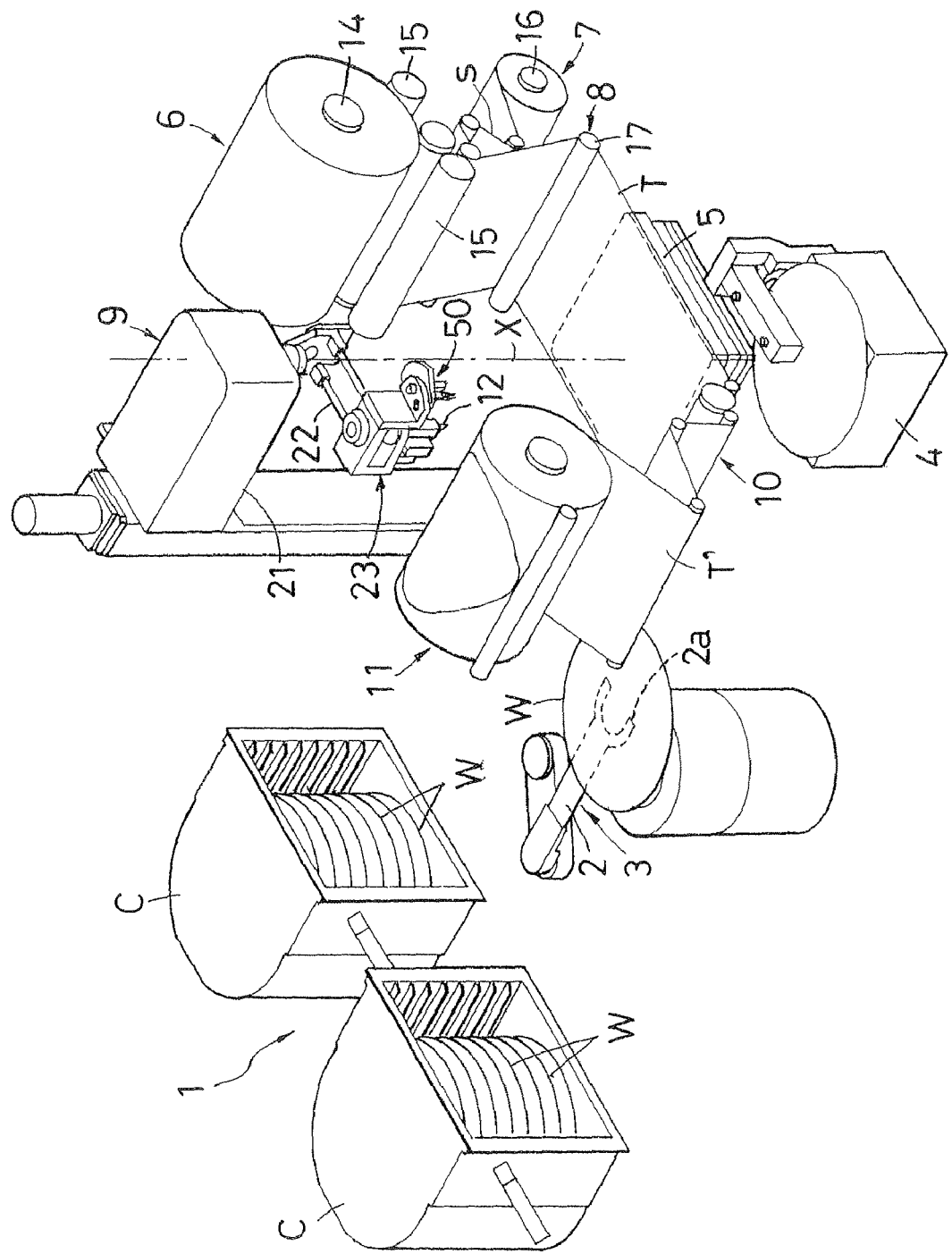
FIG. 1 is a perspective view showing an entire protective tape joining apparatus.

FIG. 1 is a perspective view showing an overall configuration of a protective tape joining apparatus.

The protective tape joining apparatus includes a wafer supplying/collecting part 1 loaded with a cassette C accommodating a semiconductor wafer (hereinafter abbreviated as simply "wafer") W; a wafer transport mechanism 3 equipped with a robot arm 2; an alignment stage 4; a chuck table 5 for mounting and suction-holding the wafer W; a tape supply part 6 for supplying a protective tape T for protecting a surface of the wafer W; a separator collecting part 7 for separating and collecting a separator s from the protective tape T provided with separator supplied from the tape supply part 6; a joining unit 8 for joining the protective tape T to the wafer W mounted and suction-held on the chuck table 5; a protective tape cutting device 9 for cutting out the protective tape T joined to the wafer W along an outer shape of the wafer W; a separation unit 10 for separating an unnecessary tape T" after being joined to the wafer W and cut off; a tape collecting part 11 for winding up and collecting the unnecessary tape T' separated by the separation unit 10; and the like. Specific configuration of each structural part and mechanism will be described below.

The wafer supplying/collecting part 1 is configured to with two cassettes C in parallel so as to be loaded. In each cassette C, a great number of wafers W are inserted and accommodated in a plurality of stages in a horizontal orientation with wiring pattern surfaces (surface) facing upward.

The robot arm 2 equipped on the wafer transport mechanism 3 is configured to be horizontally advance/retreat movable, and can be entirely rotated and lifted. A wafer holder 2a having a horseshoe-shape and suctioning by vacuum is arranged at a distal end of the robot arm 2. The wafer holder 2a suction-holds the wafer W from the back surface by being inserted into a gap between the wafers accommodated into the plurality of stages in the cassette C, pulls out the suction-held wafer W from the cassette C, and transports the wafer W, in turn, to the alignment stage 4, the chuck table 5, and the wafer supplying/collecting part 1.

The alignment stage 4 aligns the wafer W transported and mounted by the wafer transport mechanism 3 in accordance with the notch or the orientation flat formed on the outer periphery of the wafer W.

Figure 2:
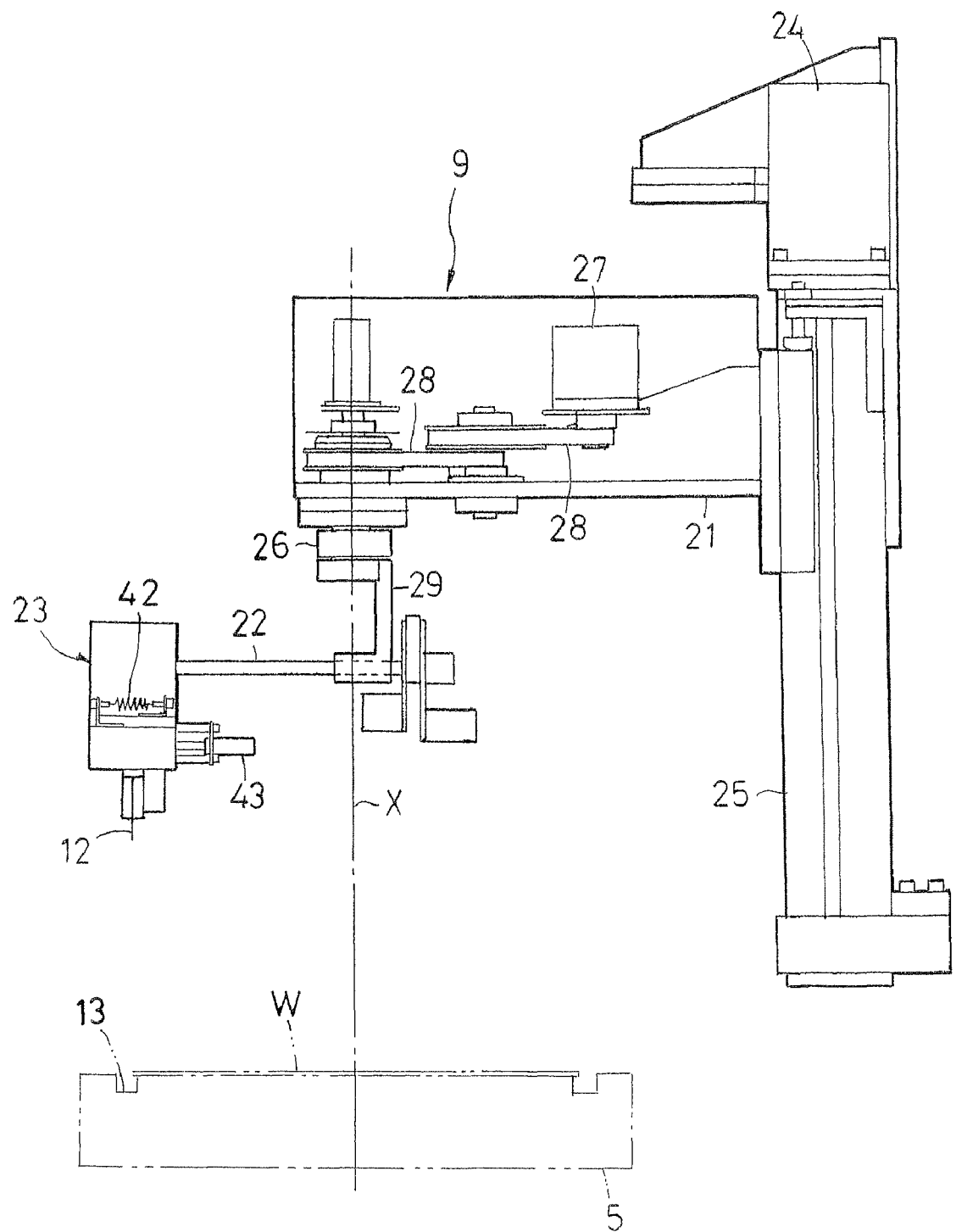
FIG. 2 is a side view showing an entire protective tape cutting device.

The chuck table 5 suctions by vacuum the wafer W moved from the wafer transport mechanism 3 and mounted in a predetermined alignment attitude. A cutter running groove 13, shown in FIG. 2, is formed on an upper surface of the chuck table 5, to rotate a cutter blade 12 included in the protective tape cutting device 9, which is to be described later, along the outer shape of the wafer W and cut the protective tape T.

The tape supply part 6 is configured to wind and guide the protective tape T with a separator fed out from a supply bobbin 14 to a group of guide rollers 15, and lead the protective tape T separated from the separator s to the joining unit 8. The supply bobbin 14 is configured such that an appropriate rotational resistance is applied and the tape is not excessively fed.

The separator collecting part 7 is configured such that a collecting bobbin 16 which winds up the separator s separated from the protective tape T is rotatably driven in a wind up direction.

The joining unit 8 includes a joining roller 17 arranged forward and horizontally. Therefore, the joining unit 8 can reciprocate in the horizontal direction to the left and the right by a slide guiding mechanism 18 shown in FIG. 11 and a screw-feeding drive mechanism (not shown).

The separation unit 10 includes a separation roller 19 forward and horizontally. Therefore, the separation unit 10 reciprocates in the horizontal direction to the left and the right by the slide guiding mechanism 18 and the screw-feeding drive mechanism (not shown).

Returning to FIG. 1, the tape collecting part 11 is configured such that a collecting bobbin 20 which winds up the unnecessary tape T' is rotatably driven in a wind up direction.

A tape cutting mechanism 9 basically includes a pair of supporting arms 22 arranged in parallel so as to be rotatable about a vertical axis X positioned on the center of the chuck table 5 under a movable table 21 which is liftably driven. A cutter unit 23 arranged at a free end of the supporting arm 22 is attached with the cutter blade 12 with the blade edge facing downward. That is, when the supporting arm 22 rotates about the vertical axis X as the center, the cutter blade 12 moves along the outer periphery of the wafer W and cuts out the protective tape T. The detailed structure thereof is shown in FIGS. 2 to 5.

The movable table 21 is fed by screwing and lifted along a vertical rail 25 by forward-reverse rotating a motor 24. A turning shaft 26 arranged turnably about the vertical axis X at the free end of the movable table 21 is cooperatively coupled in a decelerating manner to a motor 27 arranged on the movable table 21 by way of two belts 28. That is, the turning shaft 26 is turned in a predetermined direction by the operation of the motor 27.

The supporting arm 22 passes through a lower end of a supporting member 29 extended downward from the turning shaft 26, and is supported so as to be adjustable to slide in the horizontal direction. That is, the distance from the vertical axis X, which is the center of rotation, of the cutter blade 12 is adjusted by the slide adjustment of the supporting arm 22. In other words, a rotation radius of the cutter blade 12 can be changed and adjusted in correspondence with a wafer diameter.

Figure 3:
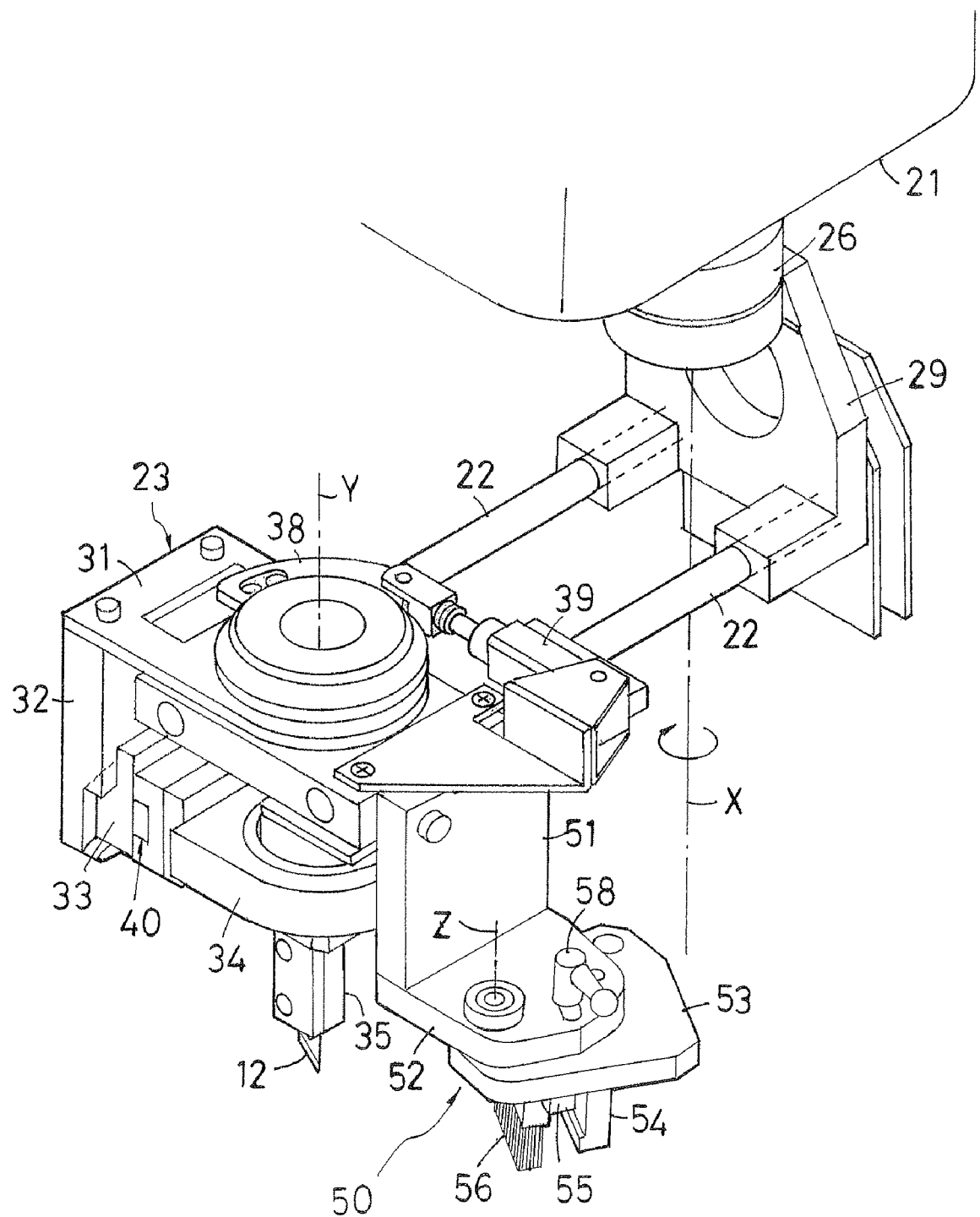
FIG. 3 is a perspective view showing the main parts of the protective tape cutting device.
Figure 4:
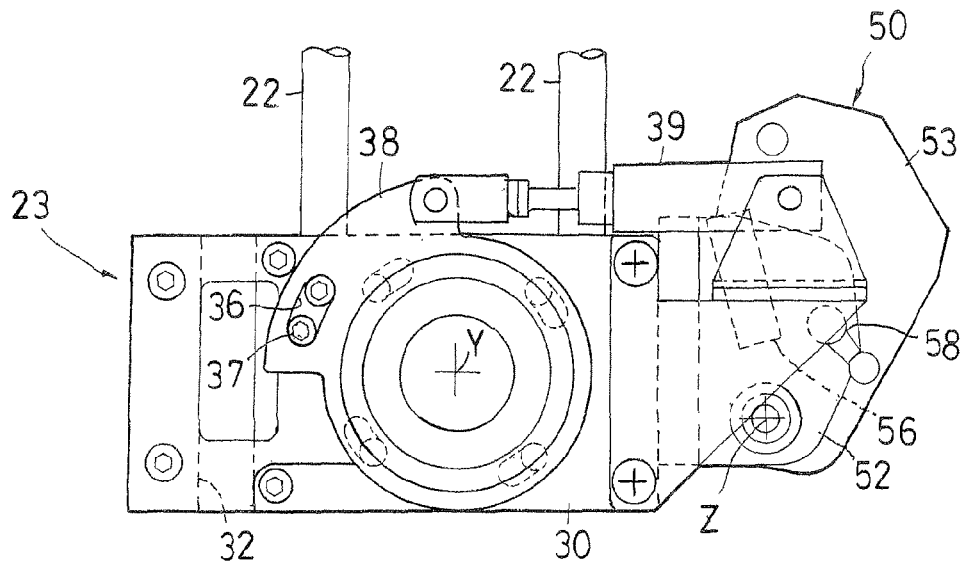
FIG. 4 is a plan view of a cutter unit.
Figure 5:
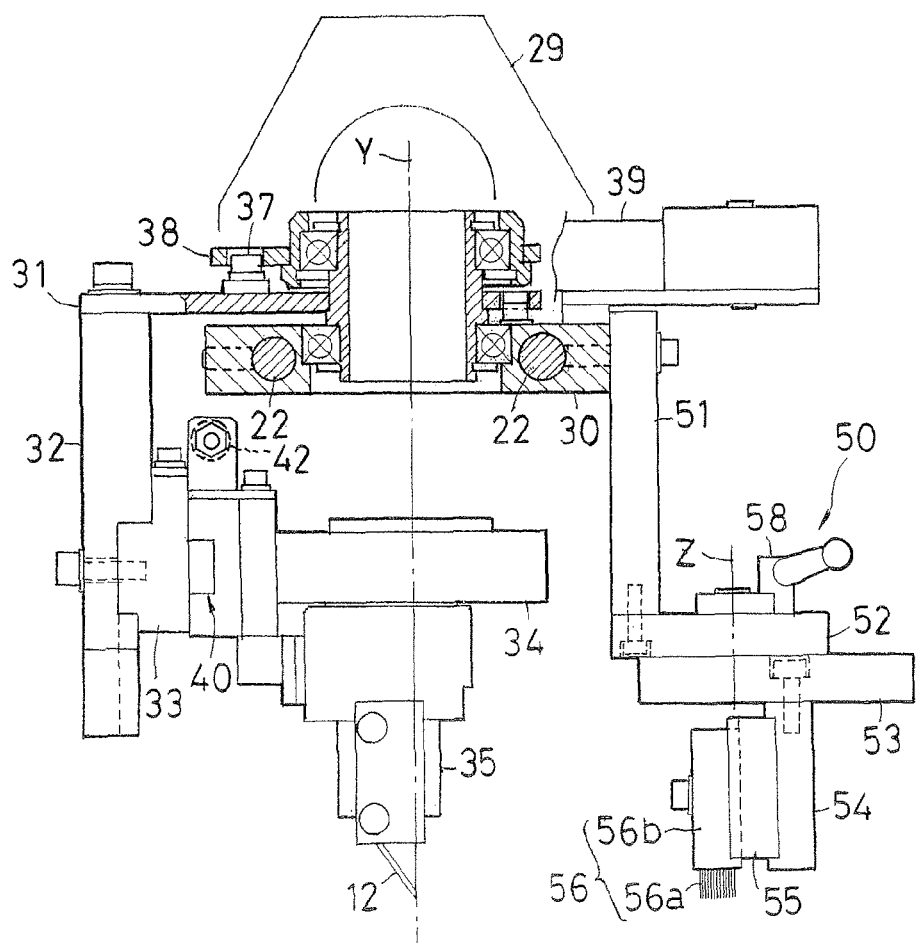
FIG. 5 is a plan view of a dust collecting mechanism.
Figure 6:
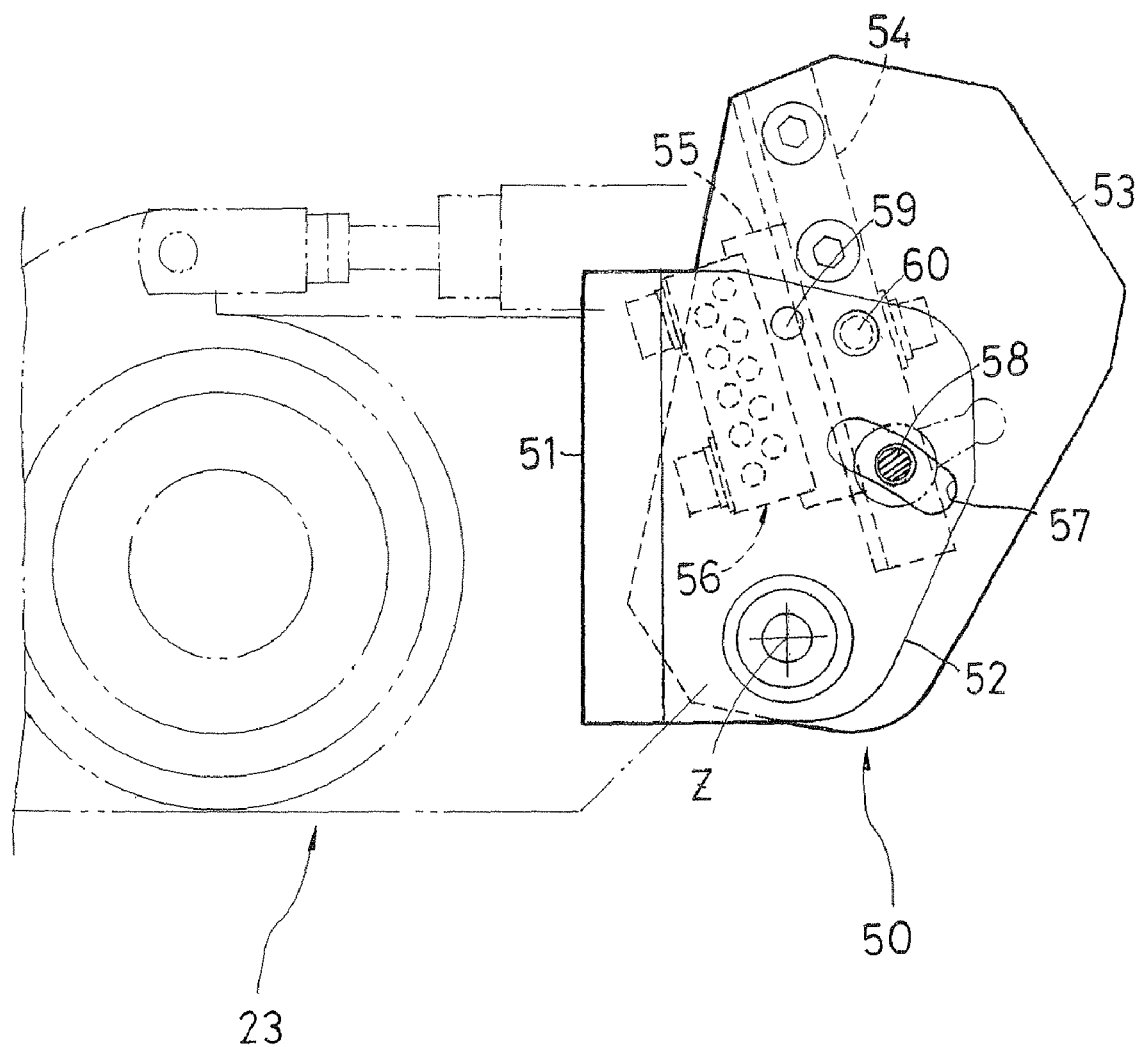
FIG. 6 is a side view showing the main parts in a case where a cutter blade is pierced through the protective tape.

As shown in FIG. 4, a bracket 30 is securely attached to the free ends of the supporting arms 22. The cutter unit 23 is attached to the bracket 30. As shown in FIGS. 3 and 5, the cutter unit 23 is configured by a turning member 31 turnably supported by the bracket 30 within a predetermined range about a vertical axis Y, a supporting bracket 32 in a vertical wall shape coupled to a lower surface of an end of the turning member 31, a cutter supporting member 33 coupled to a side surface of the supporting bracket 32, a bracket 34 supported by the cutter supporting member 33, a cutter holder 35 attached to the bracket 34, and the like. The cutter blade 12 is replaceably fastened to a side surface of the cutter holder 35.

As shown in FIG. 4, an operation flange 38 which integrally turns with the turning member 31 by engagement between a long hole 36 and a projection 37 is arranged above the turning member 31. The attitude about the vertical axis Y of the entire cutter unit 23 with respect to the supporting arm 22 is changed by turning the operation flange 38 with an air cylinder 39. An angle (cut-in angle) of the cutter blade 12 with respect to a movement direction when cutting the protective tape T then can be adjusted within a predetermined range.

With respect to the cutter supporting member 33, the bracket 34 is supported in a linearly slidable manner in a longitudinal direction (front and back direction of the plane of drawing in FIG. 5) of the supporting arm 22 by way of a guide rail mechanism 40. A spring 42 is arranged across the cutter supporting member 33 and the bracket 34, as shown in FIG. 2. The bracket 34 is slidingly biased in a direction of approaching to the vertical axis (center of rotation) X by a spring restoration force of the spring 42.

Figure 9:
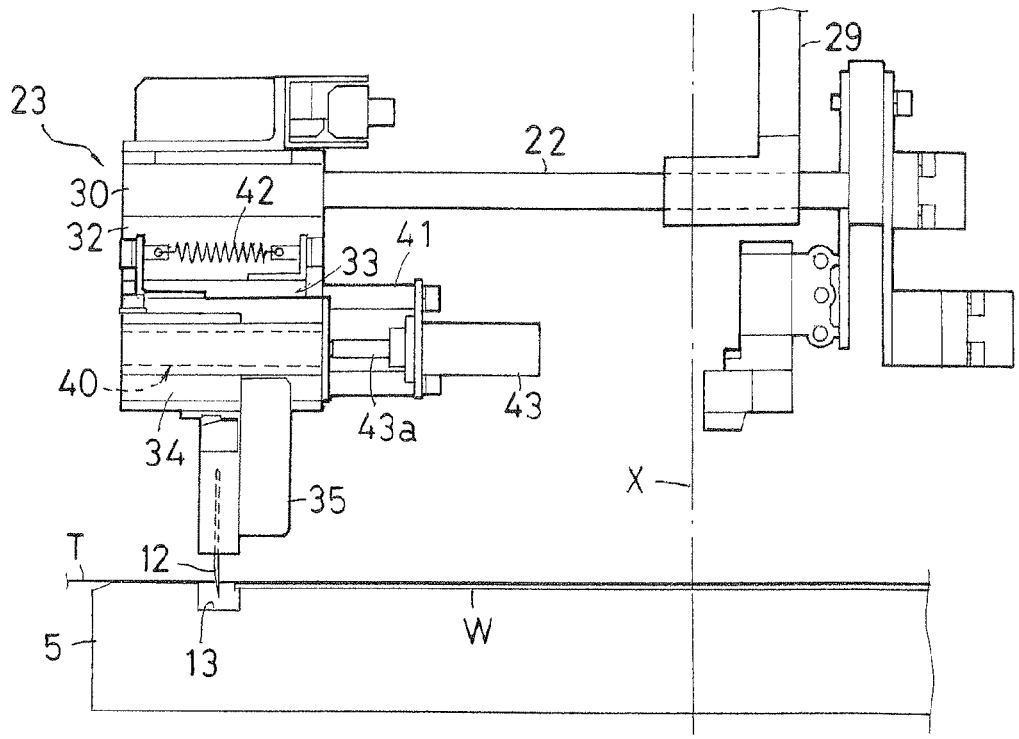
FIG. 9 is a side view showing the main parts in the case where the cutter blade is pierced through the protective tape.

As shown in FIG. 9, an air cylinder 43 in an attitude along the sliding direction of the bracket 34 is fixed and arranged by way of a stator 41 on the rotation center side of the cutter supporting member 33. A piston rod 43a of the air cylinder 43 is arranged so as to be in contact with the end face of the bracket 34.

As shown in FIG. 3 to FIG. 8, a dust collecting mechanism 50 for collecting microscopic dust generated from the tape cutting and attached to the upper surface of the protective tape T is attached on a side opposite to a running direction of the cutter blade in the bracket 30. The dust collecting mechanism 50 is configured by a vertical bracket 51 coupled to an end side of the bracket 30 and extended downward, a horizontal bracket 52 coupled and fixed horizontally to a lower end of the vertical bracket 51, a rotatable supporting member 53 attached to a lower surface of the horizontal bracket 52, a vertical supporting member 54 coupled to a lower surface of the rotatable supporting member 53 and suspended therefrom, a lateral supporting member 55 attached to a side surface of the vertical supporting member 54, and a dust collecting member 56 attached to a side surface of the lateral supporting member 55.

The rotatable supporting member 53 is pivotally coupled to the horizontal bracket 52 rotatable about the vertical axis Z. The rotatable supporting member 53 is fixed by fastening to the rotatable supporting member 53 a bolt 58 with a handle inserted into an arcuate long hole 57 about the vertical axis Z formed in the horizontal bracket 52. A pin hole 59 is formed in the horizontal bracket 52 at a plurality of portions (two portions in this example) of an equal distance from the vertical axis Z. The rotating attitude about the vertical axis Z of the rotatable supporting member 53 can be selected by inserting a positioning pin 60 inserted into one of the pin holes 59 to a pin hole (not shown) formed at one portion of the rotatable supporting member 53.

The dust collecting member 56 is configured as a brush having a wide width in a wafer radial direction in which thinner bristles 56a are closely planted on a holder 56b. When the cutter blade 12 reaches a height, in which the cutter blade 12 may be pierced thorough the protective tape T, with lowering of the cutter unit 23, the tip of the thinner bristles 56a is brought into contact with the protective tape T.

The position of the dust collecting member 56 can be adjusted in the up and down direction with respect to the side surface of the lateral supporting member 55, and is fastened and coupled with bolt in a removable manner from the lateral supporting member 55. The lateral supporting member 55 itself is also fastened and coupled with a bolt so as to be adjustable in a horizontal direction (brush width direction)

with respect to a vertical supporting member 54. Therefore, an operation height of the dust collecting member 56 and an operation position in the wafer radial direction can be adjusted by such adjustment, and the attitude (angle) of the dust collecting member 56 with respect to the movement direction can be adjusted by phase setting of the rotatable supporting member 53.

Figure 7:
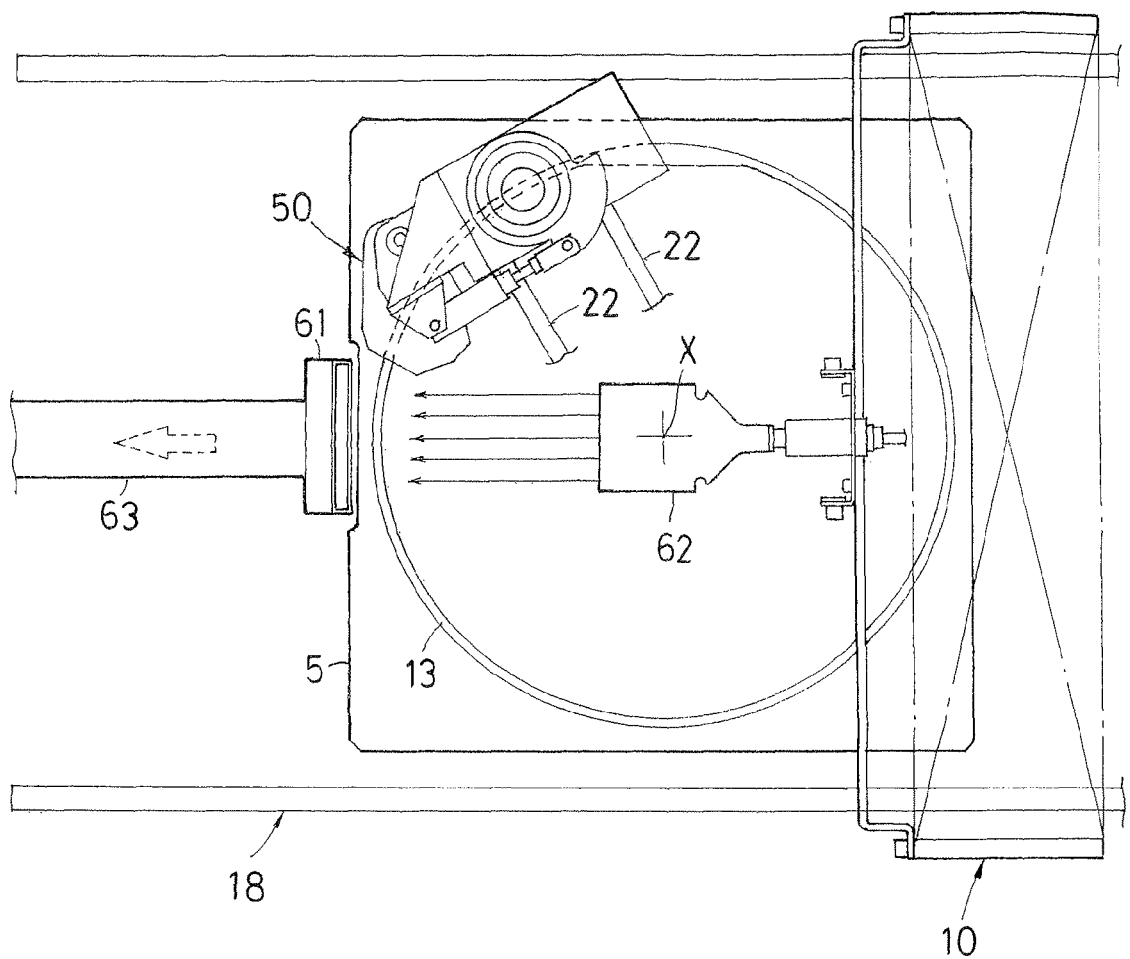
FIG. 7 is a plan view of a dust removing structure.

A suction nozzle 61 is arranged and fixed at a predetermined portion on an outer periphery of the chuck table 5, as shown in FIG. 7, to remove dust collected by the dust collecting mechanism 50. An air nozzle 62 is arranged at a rear part of the separation unit 10.

The suction nozzle 61 has an opening with a width spread in the wafer peripheral direction, and is communicated and connected to a suction device (not shown) by way of a duct 63. The air nozzle 62 has an opening of a width slightly narrower than the suction width of the suction nozzle 61. A distal end of the air nozzle 62 is directed diagonally downward so as to face the suction nozzle 61. The air nozzle 62 is communicated and connected to an air supply device (not shown). Furthermore, the air nozzle 62 is configured so as to swing up and down about a proximal axis as a center to adjust the air ejection angle.

A series of operations for joining the protective tape T to the front surface of the wafer W and cutting the same using the device according to the above embodiment will be described with reference to FIGS. 10 to 13.

When a joining command is issued, the robot arm 2 of the wafer transport mechanism 3 is first moved towards the cassette C which is mounted and loaded in the cassette table. The wafer holder 2a is inserted into a gap between the wafers accommodated in the cassette C, and the wafer W is suction-held from the back surface (lower surface) by the wafer holder 2a and transported. The robot arm 2 moves and mounts the wafer W taken out to the alignment stage 4.

The wafer W mounted on the alignment stage 4 is aligned using the notch n formed at the outer periphery of the wafer W. The aligned wafer W is again transported by the robot arm 2 and mounted on the chuck table 5.

Figure 11:
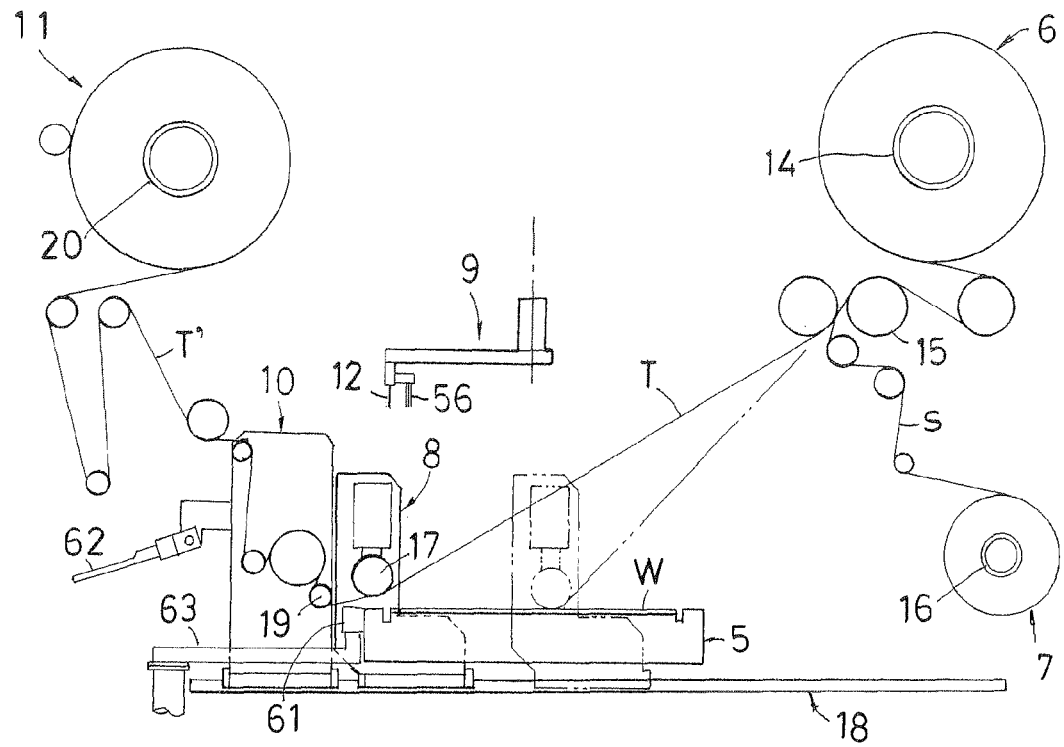
FIGS. 11 to 14 are front views each showing a protective tape joining process.

The wafer W mounted on the chuck table 5 is suction-held while being aligned such that its center is on the center of the chuck table 5. As shown in FIG. 11, the joining unit 8 and the separation unit 10 are standby at the initial position on the left side, and the cutter blade 12 of the tape cutting mechanism 9 is standby at the initial position on the upper side.

As shown with a virtual line in FIG. 11, the joining roller 17 of the joining unit 8 is lowered, and the joining roller 17 is rolled forward (right direction in FIG. 11) on the wafer W while pressing downward the protective tape T. The protective tape T is thereby joined to the entire surface of the wafer W and the upper surface of the chuck table 5.

Figure 12:
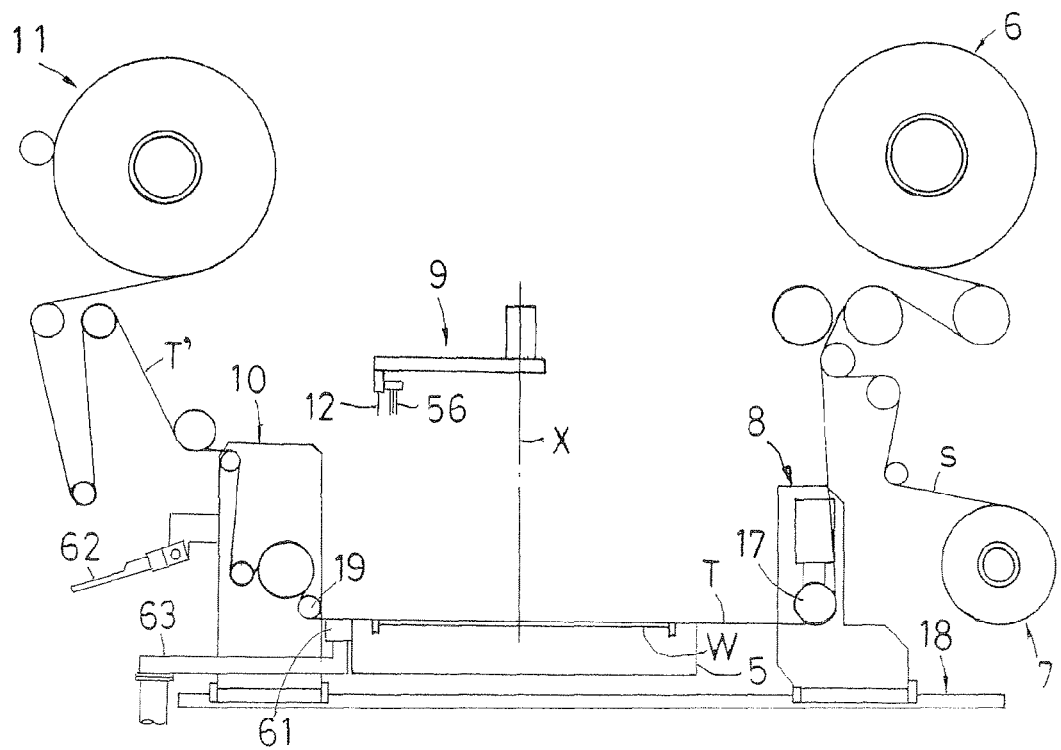
Figure 13:
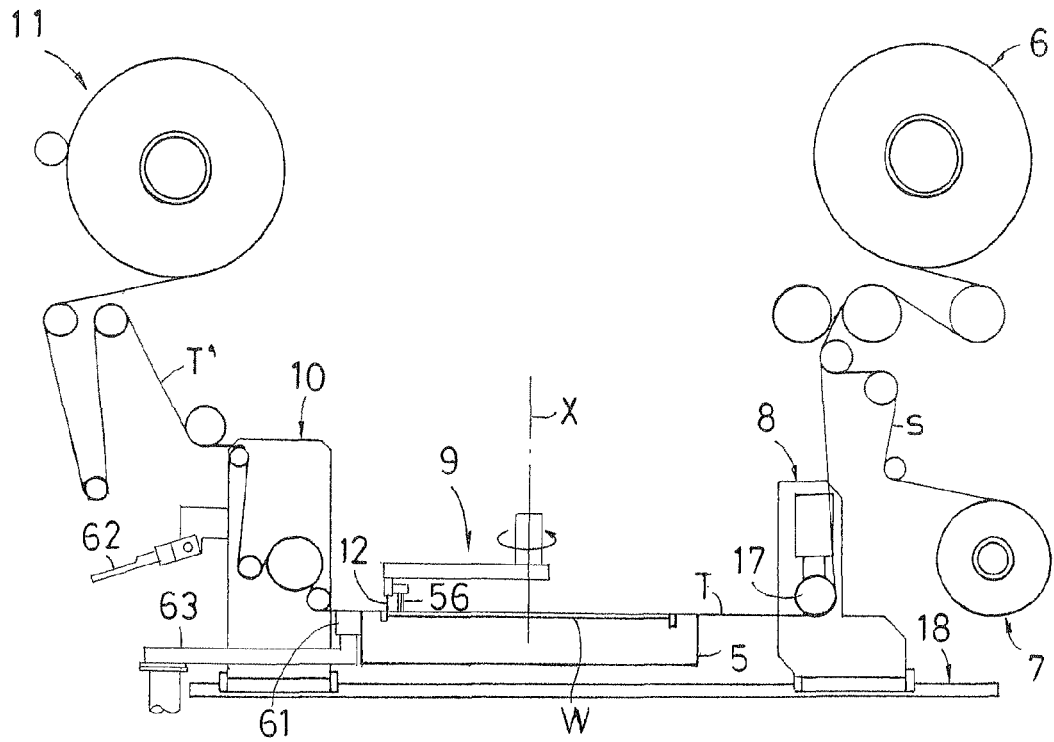

When the joining unit 8 reaches a completion position, as shown in FIG. 12, the cutter blade 12 in standby at the upper side is lowered, as shown in FIG. 13. Accompanied with such operation, the cutter blade 12 is pierced through the protective tape T positioned in a cutter running groove 13 of the chuck table 5. At the same time, a tip of the bristles of the dust collecting member 56 in the dust collecting mechanism 50 is brought into contact with the protective tape T at an appropriate pressure.

Figure 10:
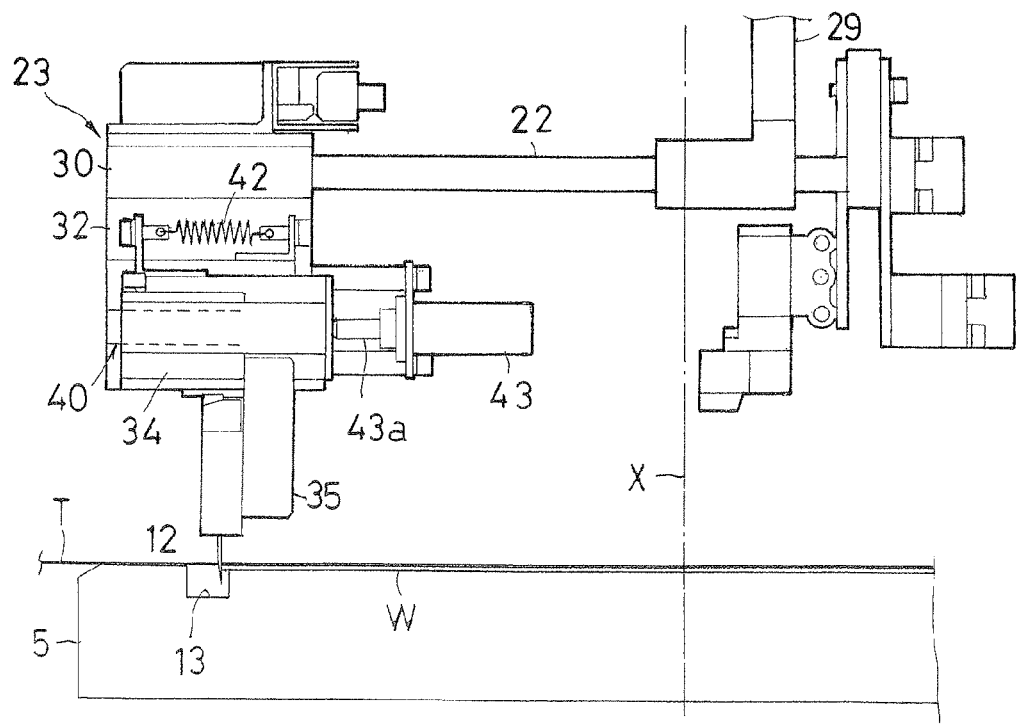
FIG. 10 is a side view showing the main parts of the state in which the cutter blade is brought into contact with an outer peripheral edge of the wafer.

In this case, as shown in FIG. 9, high pressure air is supplied to the air cylinder 43, so that the piston rod 43a projects out. The bracket 34 is slidably moved to the outer stroke end against the spring 42. The cutter blade 12 is pierced through the protective tape T at the position slightly spaced apart (a few millimeters) outward from an outer peripheral edge of the wafer W. The air pressure of the air cylinder 43 is then reduced such that a projection force of the piston rod 43a becomes smaller than the spring force. Accompanied therewith, the bracket 34 is slidably moved to the wafer center side by a pressing bias force of the spring 42, and a blade edge of the cutter blade 12 is pressed against the outer peripheral edge of the wafer W at an appropriate contact pressure, as shown in FIG. 10.

After the pressing and the setting of the cutter blade 12 to the outer peripheral edge of the wafer are completed at the cutting start position of the cutter blade 12, the supporting arm 22 is rotated as shown in FIG. 13. Accompanied therewith, the cutter blade 12 rotatably moves while slidably contacting the outer peripheral edge of the wafer, thereby cutting the protective tape T along the outer periphery of the wafer.

Figure 14:
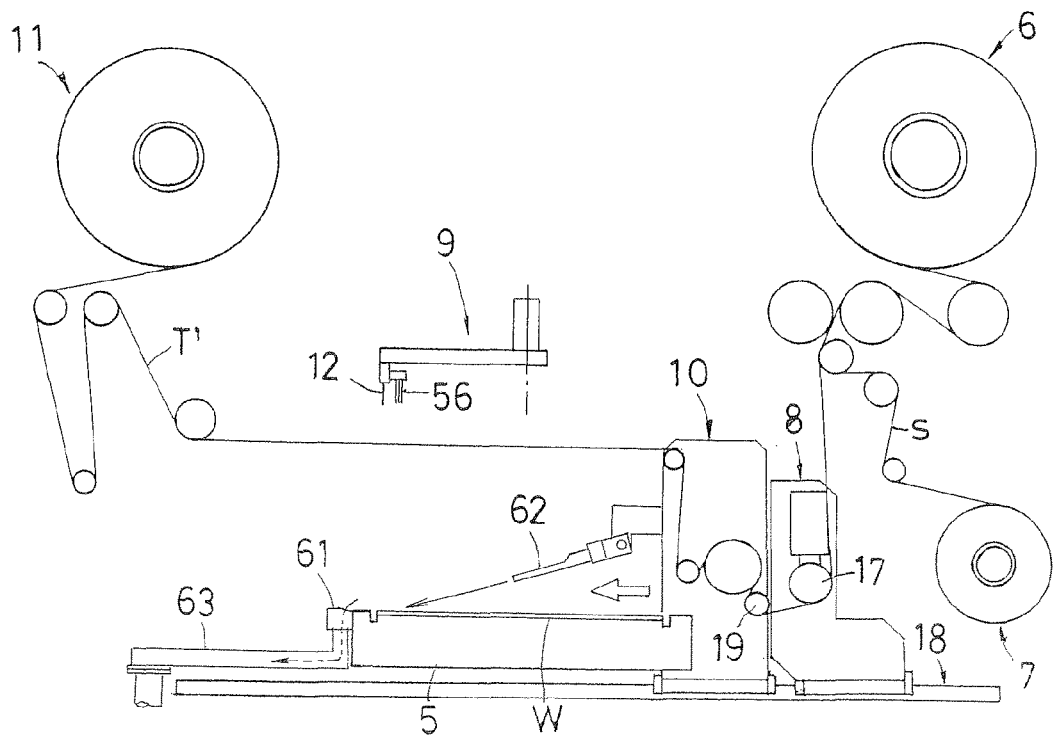

After the protective tape T is cut, the cutter blade 12 is lifted up to the original standby position, as shown in FIG. 14. The separation unit 10 then winds up and separates the remaining unnecessary tape T', which is cut on the wafer W, while moving forward.

After the separation unit 10 reaches the separation complete position, the separation unit 10 and the joining unit 8 move backward and return to the initial position. The unnecessary tape T' is wound up by the collecting bobbin 20, and a constant amount of the protective tape T is fed out from the tape supply part 6.

After the joining of the protective tape T is completed, the suction at the chuck table 5 is released, and the wafer W subjected to the joining process is moved and mounted by the wafer holder 2a of the robot arm 2 and inserted and collected in the cassette C of the wafer supplying/collecting part 1.

One tape joining process is thereby completed, and such operation is sequentially repeated thereafter in correspondence to a transport of a new wafer.

Figure 15:
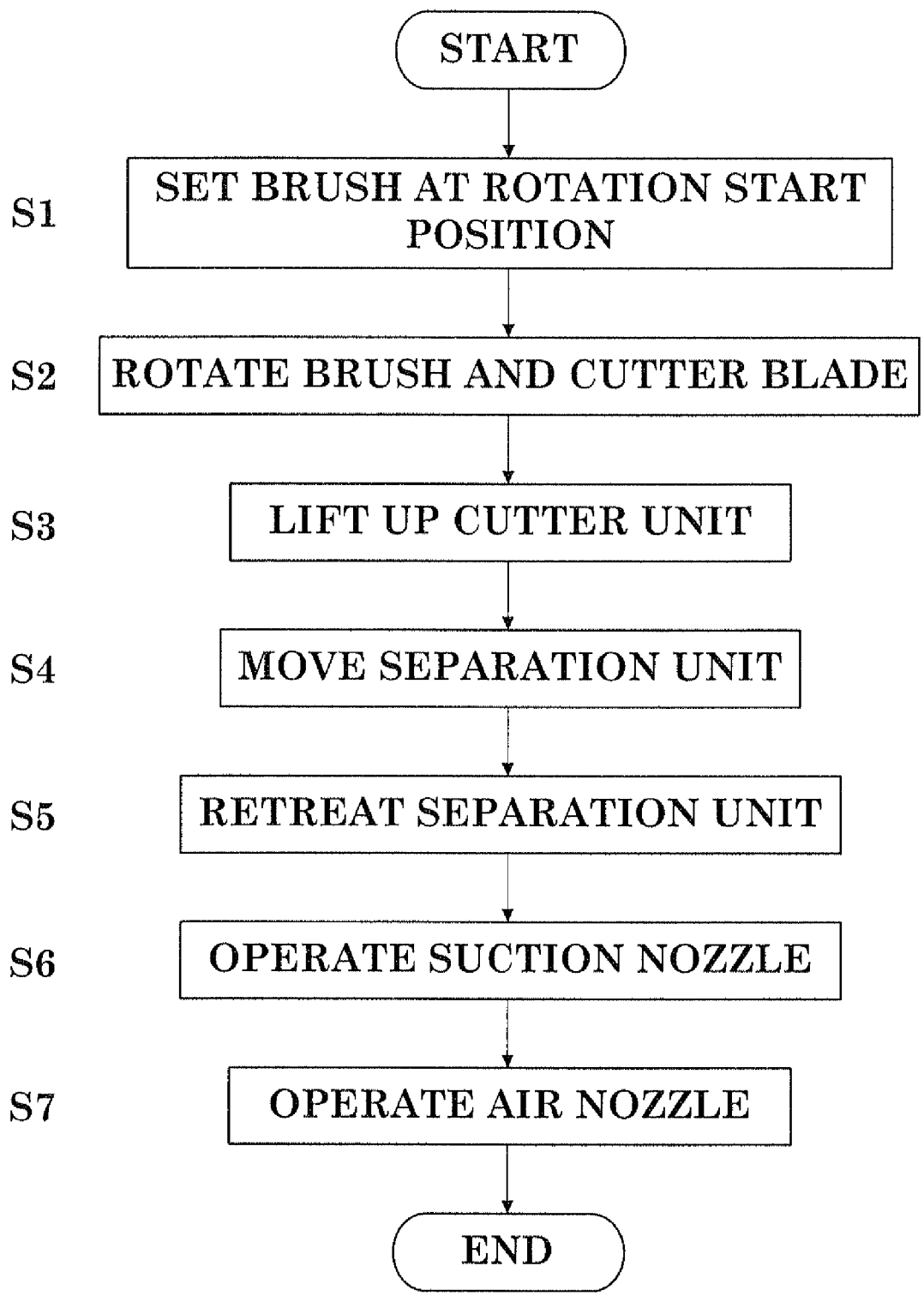
FIG. 15 is a flowchart showing a dust removing operation.

In the device of the present embodiment, the microscopic dust generated in cutting the protective tape T is removed in the following manner by the dust collecting mechanism 50 in the tape cutting step. The dust removing operation will be described along the flowchart of FIG. 15.

At the same time as the completion of the pressing and the setting of the cutter blade 12 to the outer peripheral edge of the wafer at the cutting start position of the cutter blade 12, the brush 56 also moves to the rotation start position. That is, the dust collecting member 56 (hereinafter appropriately referred to as "brush 56") is positioned in front of the suction nozzle 61 (step S1).

After the cutting preparation is completed, the cutter blade 12 is rotated to cut the protective tape T along the outer periphery of the wafer. Accompanied therewith, the brush 56 of the dust removing mechanism 50 slidably moves on the upper surface of the protective tape T while following behind the cutter blade 12, and collects the dust freed from the tape cut edge and attached to the upper surface of the tape (step S2).

In this case, the brush 56 is arranged so as to be slightly inclined with respect to the movement direction and cross the tape cut edge in plan view. Therefore, the dust attached to the upper surface of the tape on both sides of the tape cut edge is collected on the protective tape on the wafer side by the brush 56 which moves in an inclined attitude.

Figure 8A:
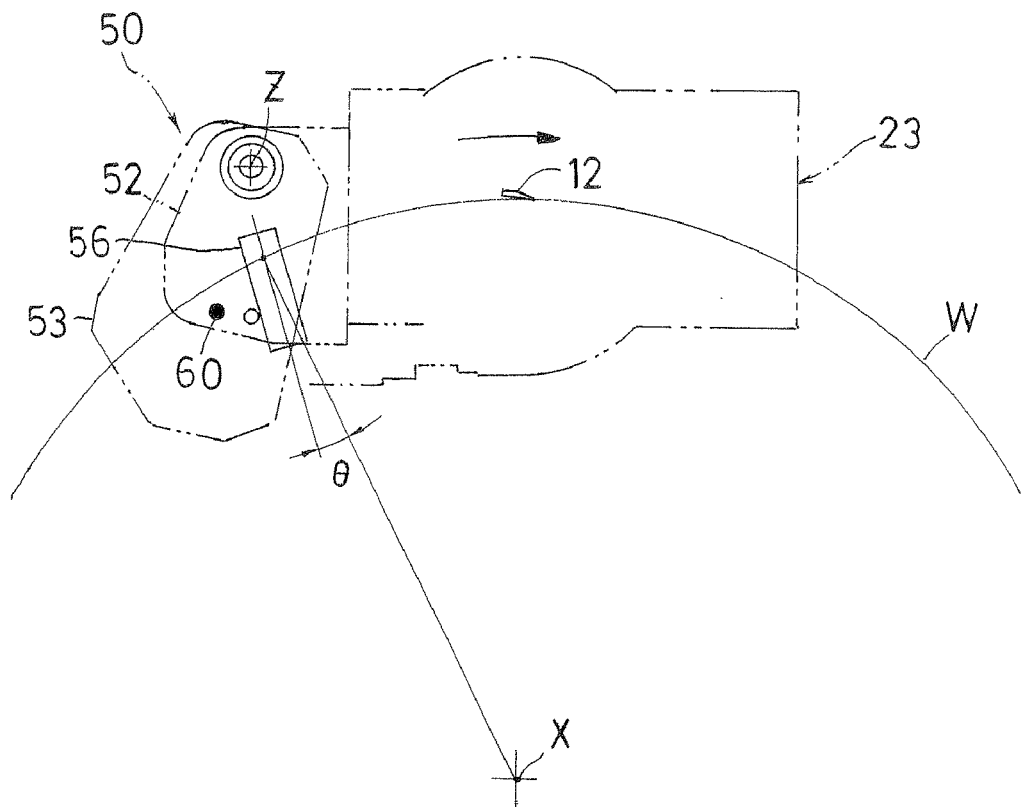
FIG. 8 is a plan view showing an attitude switching state of the dust collecting member.
Figure 8B:
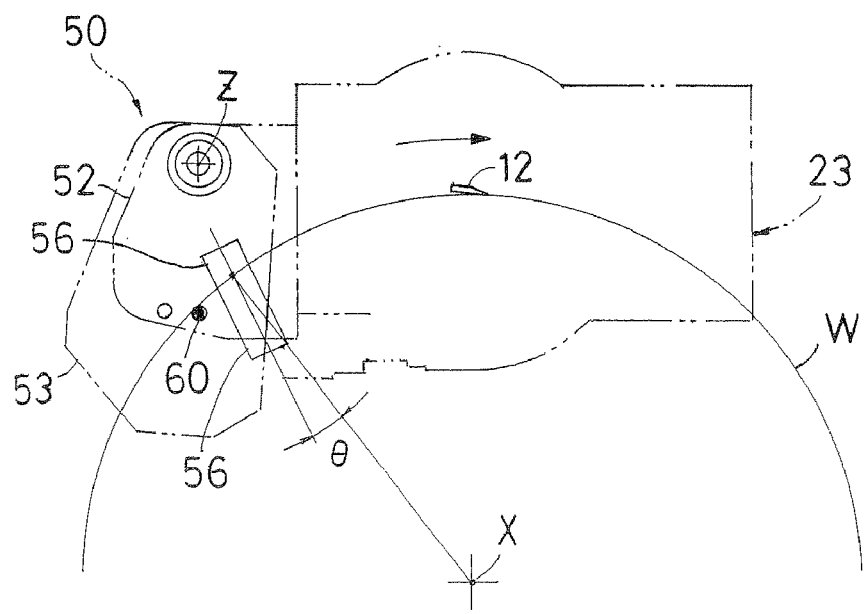

The attitude adjustment of the brush 56 is carried out based on a curvature of the tape cut edge, that is, a radius of the wafer W. For instance, as shown in FIG. 8a, the rotatable supporting member 53 is rotatably adjusted in the direction of moving away from the cutter blade 12 (clockwise direction in FIG. 8a) about the vertical axis Z at the wafer with a larger radius (e.g., 12 inches). As shown in FIG. 8b, the rotatable supporting member 53 is rotatably adjusted in the direction of moving closer to the cutter blade 12 (counterclockwise direction in FIG. 8b) about the vertical axis Z at the wafer W with a smaller radius (e.g., 8 inches), so that a delay angle θ of the brush 56 with respect to the movement direction of the brush is adjusted to an angle range suitable for gathering and collecting the dust to the wafer side.

The cutter unit 23 lifts to a retreat position after the cutting of the tape is completed (step S3). Thereafter, when the separation unit 10 moves forward and reaches the separation complete position, the separation unit 10 moves backward (step S4). When the air nozzle 62 arranged at the rear part of the separation unit 10 reaches a predetermined blow start position, the suction of the suction nozzle 61 is first started (step S5) as shown in FIG. 14. After a predetermined time (e.g., 0.5 to 1.0 second) thereafter, the air blow of the air nozzle 62 is started towards the dust collected in front of the suction nozzle 61 (step S6).

The separation unit 10 moves backward, and the air nozzle 62 moves closer towards the suction nozzle 61 while performing air blow towards the upper surface of the tape (step S7). Accompanied therewith, the dust collected near the cutting start position by the circling movement of the brush 56 is freed by the air blow and suctioned by the suction nozzle 61.

As described above, the dust generated from the protective tape T cut with the rotation of the cutter blade 12 is collected to the front of the suction nozzle 61 by the brush 56 following behind the cutter blade 12, and then suctioned and removed, and thus the dust does not deposit and attach on the protective tape on the wafer side. Therefore, in the back surface grinding in the post-process, the wafer W can be suction-held while maintaining planarity in the surface of the protective tape, and thus an even thickness of the wafer W after grinding can be maintained.

When carrying out the cutting of the protective tape T in a clean room, the cleanliness can be maintained since the generated dust does not scatter.

Figure 16:
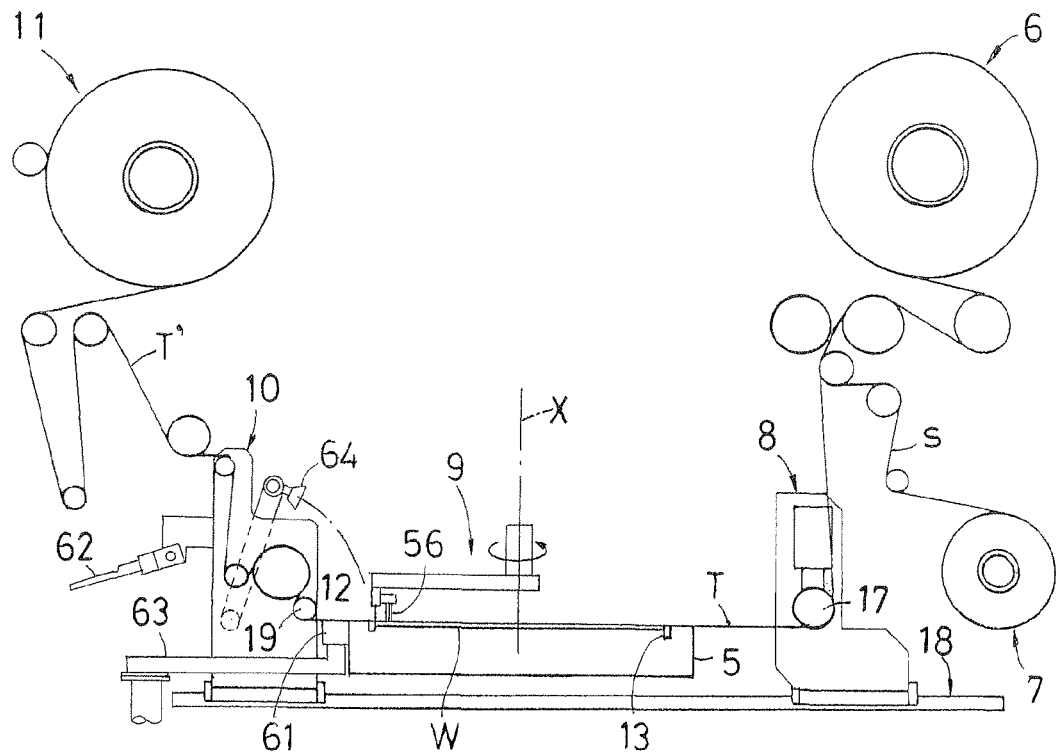
FIG. 16 is a front view showing a tape cutting process in another embodiment.
Figure 17:
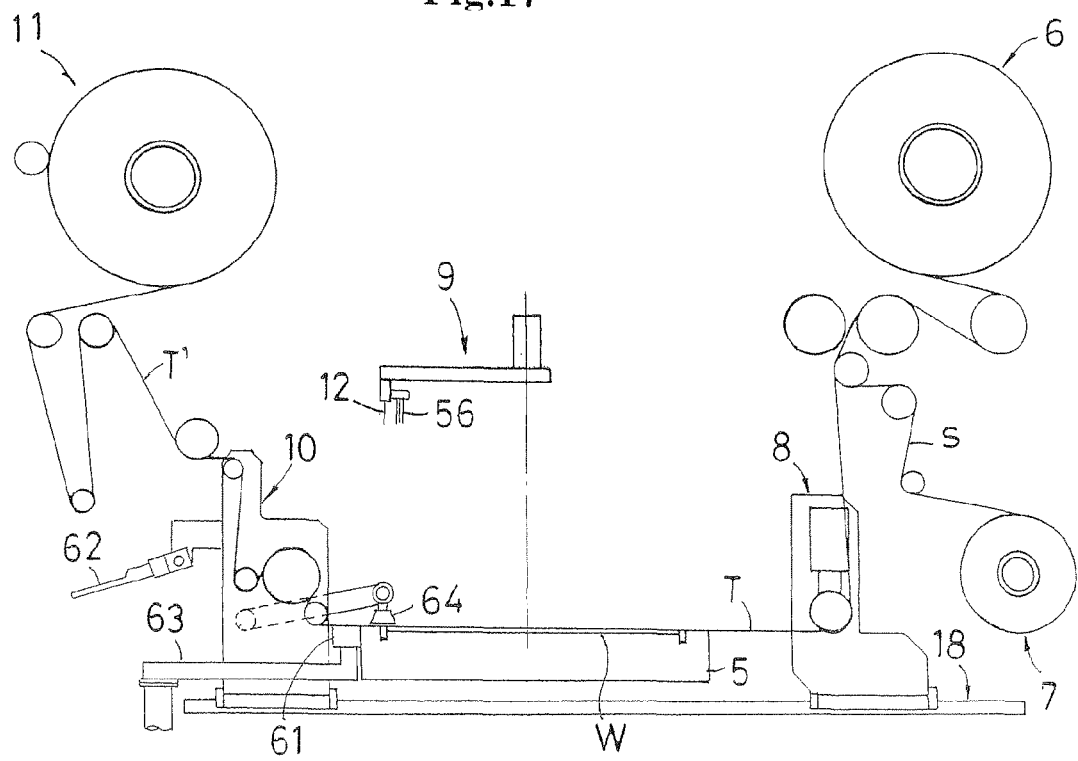
FIG. 17 is a front view showing a preliminary dust removing process in another embodiment.
Figure 18:
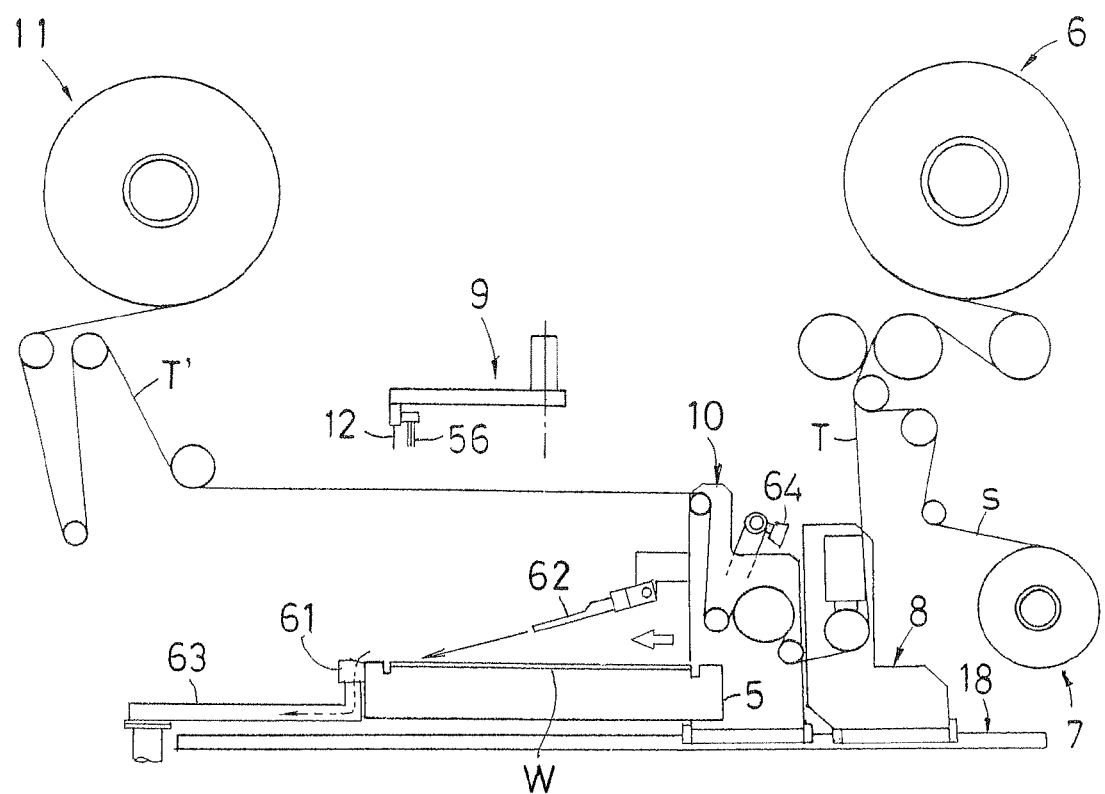
FIG. 18 is a front view showing a preliminary dust removing process in another embodiment.

A dust removing process using a dust removing structure of another embodiment is shown in FIGS. 16 to 18.

In this case, an auxiliary suction nozzle 64 capable of being liftingly switched to an upper retreat position and a lower operation position is separately arranged at a front part of the separation unit 10. The auxiliary suction nozzle 64 operates in the following manner.

That is, as shown in FIG. 16, in the process of rotatably moving the cutter blade 12 and cutting the protective tape T, the auxiliary suction nozzle 64 is at the upper retreat position. After the tape cutting is completed, the auxiliary suction nozzle 64 is lowered in a swing manner up to over the dust collected by the brush 56 which rotatably moves with the cutter blade 12 to preliminary suction and remove one part of the dust, as shown in FIG. 17. Thereafter, as shown in FIG. 18, the separation unit 10 is moved forward to wind up and collect the unnecessary tape T', and thereafter, the dust remaining on the protective tape on the wafer side is suctioned and removed by air blow and suction, similar to the device in the embodiment described above.

In this case, in the preliminary dust removing process by the auxiliary suction nozzle 64, the dust deposited on the unnecessary tape T' on the outer side of the tape cut edge is mainly suctioned and removed by the auxiliary suction nozzle 64. The dust deposited on the unnecessary tape T' is thus prevented from scattering around when the unnecessary tape T' is wound up and collected by the forward movement of the separation unit 10.

The present invention is not limited to the above embodiments, and may be modified as below.

(1) In the above embodiments, the following configuration may be adopted in place of the brush as the dust collecting member 56. A blade made of flexible resin material or resin material having slipping property, or a block or a plate made of sponge material may be used as the dust collecting member 56. In this case, configuration to remove the static electricity generated by friction is more preferable. The removal of static electricity may be carried out by blowing ion generated by an ionizer onto the protective tape T.

Figure 19:
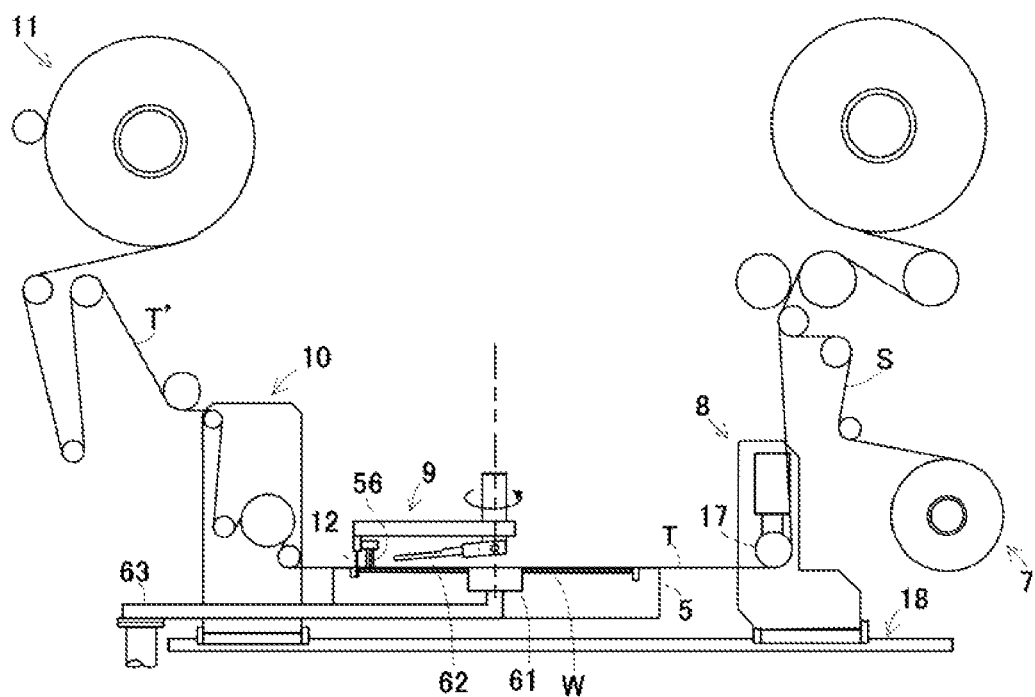
FIG. 19 is a front view showing a dust removing structure in another embodiment.
Figure 20:
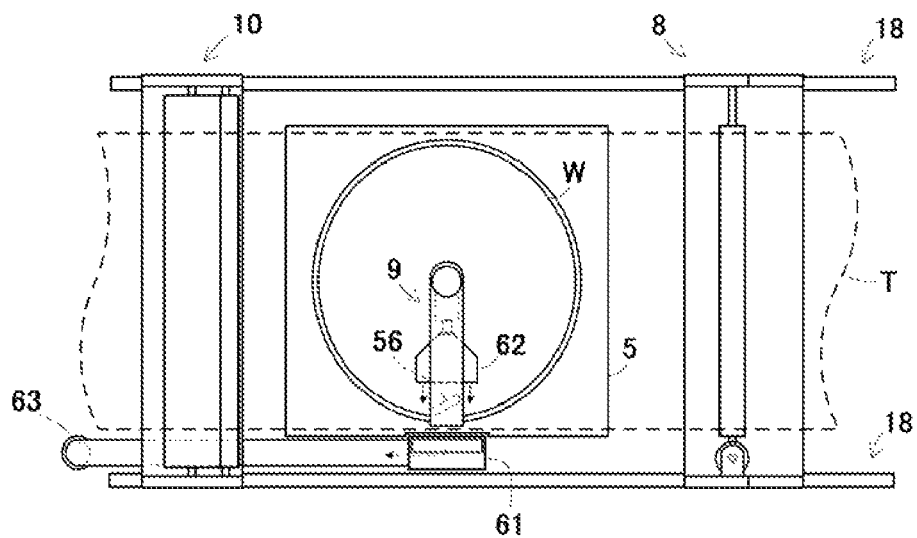
FIG. 20 is a plan view of a dust removing structure in another embodiment.
Figure 21:
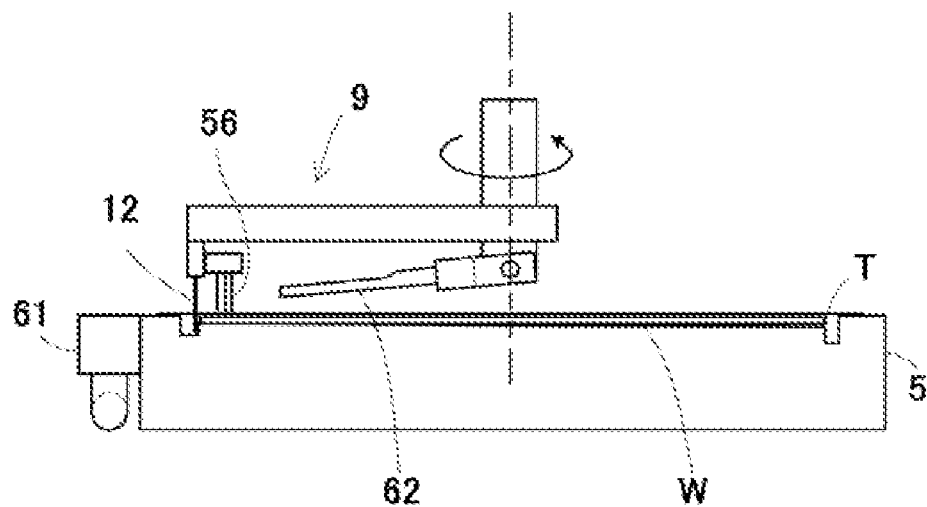
FIGS. 21 to 22 are side views showing a dust removing process in another embodiment
Figure 22:
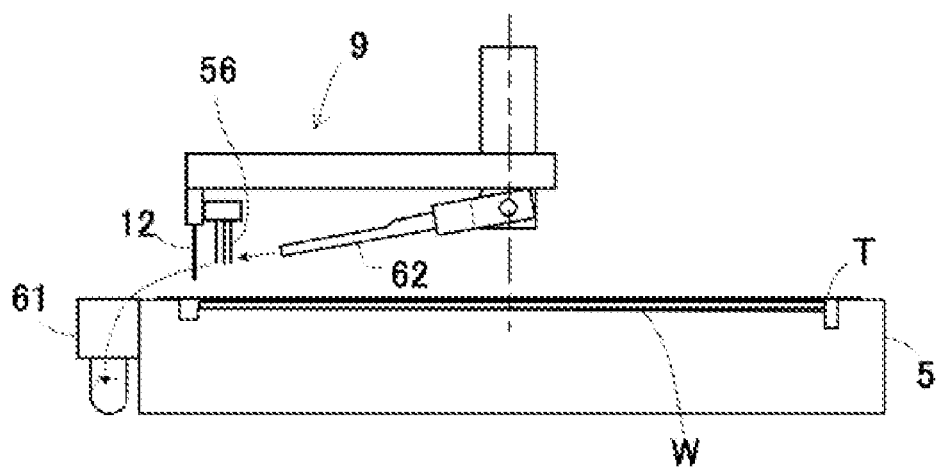

(2) The configuration is preferable to remove the dust attached to the dust collecting member 56 itself before the cutter unit 23 lifts up and returns to the retreat position after the completion of the tape cutting is preferable. For instance, after the completion of the tape cutting as shown in FIGS. 19 and 21, the brush 56 is once stopped when a distal end of the brush 56 lifts up to a microscopic distance from the surface of the protective tape T. The suction nozzle 61 is operated in this state, and the air blow is carried out towards the brush 56 by the air nozzle 62 with a time interval. In this case, the air flow of the air blow is set to adjust so as to be directed towards the opening of the suction nozzle 61, as shown in FIGS. 20 and 22.

Figure 23:
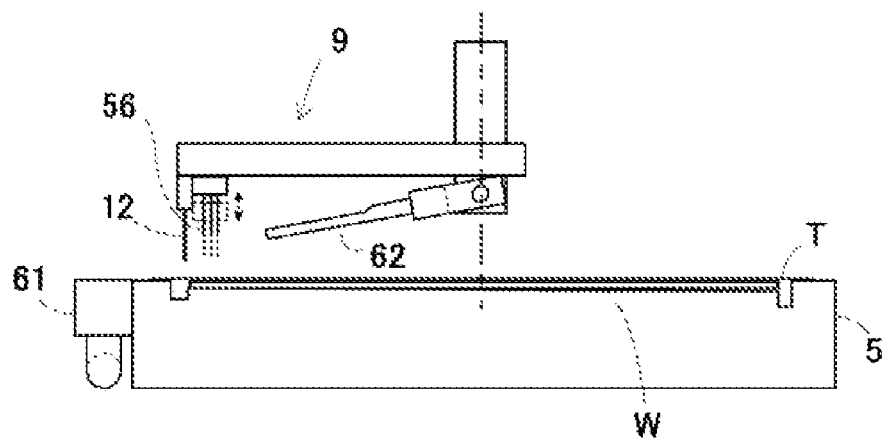
FIG. 23 is a side view showing a dust removing process in another embodiment.
Figure 24:
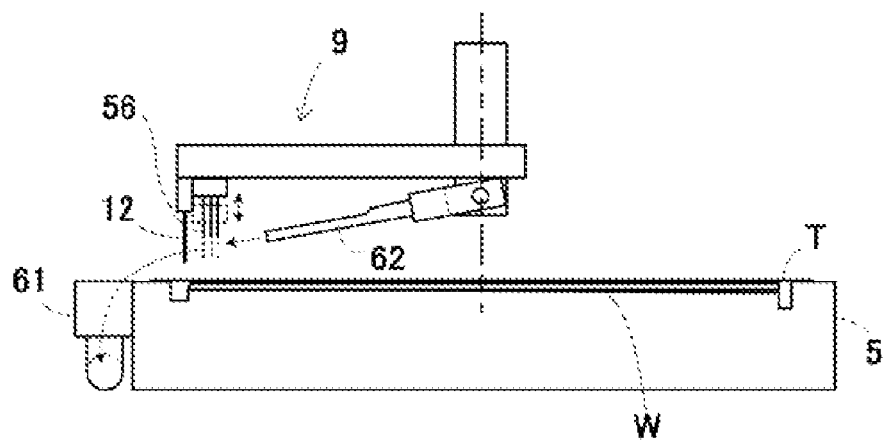
FIG. 24 is a side view showing a dust removing process in another embodiment.

As another embodiment, there may be adopted a configuration of removing the dust with a suction device separately arranged on the cutter unit 23 side, or a configuration of applying an appropriate impact or vibration to the dust collecting member 56 with a vibrator using eccentric driving of the motor and the like to brush away the dust attached to the brush 56 and the dust collected on the tape, as shown in FIGS. 23 and 24.

According to such configurations, the dust attached to the dust collecting member 56 is avoided from falling and scattering to contaminate or damage the wafer while the cutter unit 23 is being lifted or standby.

The dust attached to the brush 56 may be suctioned by the suction nozzle 61 while being brushed away.

(3) The present invention may be applied to an aspect in which the wafer W is turned with respect to the cutter blade 12 in a fixed position to cut the protective tape.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for cutting a protective tape joined to a semiconductor wafer along an outer shape of the semiconductor wafer; the method comprising the steps of:
   relatively moving a cutter blade along an outer periphery of the semiconductor wafer, and collecting dust generated at a tape cutting site by the cutter blade and attached to an upper surface of the protective tape with a dust collecting member which relatively moves with the cutter blade with respect to the semiconductor wafer; and
   suctioning and removing the dust collected at a predetermined position with the dust collecting member with a suction device after completion of tape cutting.

2. The method for cutting the protective tape on the semiconductor wafer according to claim 1, wherein the suctioning and removing are carried out by suctioning the collected dust with the suction device, and blowing air at the dust with an air nozzle.

3. The method for cutting the protective tape on the semiconductor wafer according to claim 2, wherein the suctioning is started before starting of the air blow.

4. The method for cutting the protective tape on the semiconductor wafer according to claim 2, wherein the dust collecting member is a brush;
the dust is collected with the brush before operating the suction device; and
the air blow is performed on the brush and the dust from the air nozzle while lifting up the brush to be moved away from the semiconductor wafer.

5. The method for cutting the protective tape on the semiconductor wafer according to claim 2, wherein
the dust collecting member is a brush;
the dust is collected with the brush before operating the suction device; and
the brush is vibrated after being lifted up and moved away from the semiconductor wafer.

6. The method for cutting the protective tape on the semiconductor wafer according to claim 5, wherein the dust drops off of the brush during vibration and is suctioned and removed.

7. The method for cutting the protective tape on the semiconductor wafer according to claim 2, wherein the air blow and the suctioning are performed while moving the air nozzle closer towards the suction device.

8. The method for cutting the protective tape on the semiconductor wafer according to claim 1, wherein the dust collecting member is arranged so as to be inclined with respect to a movement direction thereof based on a curvature of a cut edge of the tape, thereby providing for dust generated at the tape cutting site to be gathered and collected on a wafer side from the tape cutting site by the dust collecting member.

9. The method for cutting the protective tape on the semiconductor wafer according to claim 8, wherein the dust is suctioned and removed after separating and removing an unnecessary tape on an outer side of the wafer after cutting the tape by the cutter blade.

* * * * *